(12) United States Patent
Heo et al.

(10) Patent No.: US 12,396,336 B2
(45) Date of Patent: Aug. 19, 2025

(54) DISPLAY APPARATUS

(71) Applicant: Samsung Display Co., LTD., Yongin-si (KR)

(72) Inventors: Jihye Heo, Asan-si (KR); Ki Wook Kim, Hwaseong-si (KR); Eunbyul Jo, Daegu (KR); Joong-Soo Moon, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 128 days.

(21) Appl. No.: 16/858,735

(22) Filed: Apr. 27, 2020

(65) Prior Publication Data
US 2021/0057503 A1  Feb. 25, 2021

(30) Foreign Application Priority Data
Aug. 20, 2019  (KR) .......... 10-2019-0101625

(51) Int. Cl.
H10K 59/131  (2023.01)
H10K 59/124  (2023.01)
H10K 59/126  (2023.01)
H10K 59/80  (2023.01)

(52) U.S. Cl.
CPC ......... H10K 59/131 (2023.02); H10K 59/124 (2023.02); H10K 59/126 (2023.02); H10K 59/8791 (2023.02); H10K 59/8792 (2023.02)

(58) Field of Classification Search
CPC .................. H01L 27/3244–3279
See application file for complete search history.

(56) References Cited

U.S. PATENT DOCUMENTS

| | | | |
|---|---|---|---|
| 10,134,826 B2 | 11/2018 | Ka et al. | |
| 10,332,938 B2 | 6/2019 | Jeong et al. | |
| 11,048,113 B2 | 6/2021 | Lim et al. | |
| 2016/0064462 A1* | 3/2016 | Yoon ................ | H01L 29/78645 257/40 |
| 2016/0183382 A1 | 6/2016 | Solven et al. | |
| 2017/0345847 A1 | 11/2017 | Kim et al. | |

(Continued)

FOREIGN PATENT DOCUMENTS

| | | |
|---|---|---|
| CN | 107275369 A | 10/2017 |
| CN | 107293567 A | 10/2017 |

(Continued)

Primary Examiner — Lauren R Bell
(74) Attorney, Agent, or Firm — CANTOR COLBURN LLP

(57) ABSTRACT

A display apparatus includes a base substrate including a display area and a peripheral area adjacent to the display area, a first conductive layer including a first layer portion of a first power line and a first layer portion of a second power line, which are disposed on the base substrate in the peripheral area, and a second conductive layer a second layer portion of the first power line and a second layer portion of the second power line, which are disposed on the base substrate in the peripheral area. The first and second layer portions of the first power line overlaps and are electrically connected to each other, and the first and second layer portions of the second power line overlap and are electrically connected to each other. A portion of the first power line and a portion of the second power line overlap each other.

10 Claims, 12 Drawing Sheets

(56) References Cited

U.S. PATENT DOCUMENTS

| | | | |
|---|---|---|---|
| 2018/0145127 A1* | 5/2018 | Shin | H01L 51/5253 |
| 2018/0157110 A1* | 6/2018 | Park | H01L 51/5237 |
| 2019/0131375 A1 | 5/2019 | Kim et al. | |
| 2019/0206958 A1* | 7/2019 | Lee | H01L 27/3265 |
| 2020/0203653 A1* | 6/2020 | Um | H01L 27/3258 |

FOREIGN PATENT DOCUMENTS

| | | |
|---|---|---|
| KR | 1020140095944 A | 8/2014 |
| KR | 1020170028490 A | 3/2017 |
| KR | 1020190003905 A | 1/2019 |

\* cited by examiner

DISPLAY APPARATUS

This application claims priority to Korean Patent Application No. 10-2019-0101625, filed on Aug. 20, 2019, and all the benefits accruing therefrom under 35 U.S.C. § 119, the content of which in its entirety is herein incorporated by reference.

BACKGROUND

1. Field

Embodiments of the invention relate to a display apparatus. More particularly, embodiments of the invention relate to an organic light emitting display apparatus including a first power voltage line and a second power voltage line.

2. Description of the Related Art

Recently, a display apparatus having light weight and small size has been manufactured. A cathode ray tube ("CRT") display apparatus has been used due to a performance and a competitive price. However the CRT display apparatus has a weakness with a size or portability. Therefore, a display apparatus such as a plasma display apparatus, a liquid crystal display apparatus and an organic light emitting display apparatus has been widely used due to small size, light weight and low-power-consumption.

SUMMARY

An organic light emitting diode display apparatus may include a display area where an image is displayed and a peripheral area which is a non-display area surrounding the display area. Wires for driving pixels in the display area may be formed in the peripheral area. On the other hand, it is desired to design a structure for the wirings to prevent the display quality from being degraded due to external light reflection by the wirings.

One or more embodiment of the invention provides a display apparatus with larger display area and improved display quality by preventing uneven visibility of wiring.

According to an embodiment of the invention, a display apparatus includes a base substrate including a display area and a peripheral area, which is a non-display area and disposed adjacent to the display area, a first conductive layer including a first layer portion of a first power line and a first layer portion of a second power line, which are disposed on the base substrate in the peripheral area, and a second conductive layer including a second layer portion of the first power line and a second layer portion of the second power line, which are disposed on the base substrate in the peripheral area. In such an embodiment, the second layer portion of the first power line overlaps the first layer portion of the first power line and is electrically connected to the first layer portion of the first power line, and the second layer portion of the second power line overlaps the first layer portion of the second power line and is electrically connected to the first layer portion of the second power line. In such an embodiment, a portion of the first power line and a portion of the second power line overlap each other.

In an embodiment, a first power voltage may be applied to the first power line, and a second power voltage different from the first power voltage may be applied to the second power line.

In an embodiment, the display apparatus may further include a first via insulating layer disposed between the first conducive layer and the second conductive layer. The first via insulating layer may include an organic insulating material.

In an embodiment, a portion of the second layer portion of the first power line may overlap a portion of the first layer portion of the second power line.

In an embodiment, the display apparatus may further include a cover electrode disposed on the first layer portion of the first power line and the first layer portion to cover a portion where the first layer portion of the first power line and the first layer portion of the second power line are spaced apart from each other.

In an embodiment, the display apparatus may further include a pixel electrode disposed in the display area on the base substrate, a light emitting layer on the pixel electrode, and an opposite electrode on the light emitting layer. In such an embodiment, the cover electrode may be disposed in a same layer as the pixel electrode and may include a same material as the pixel electrode.

In an embodiment, the display apparatus may further include a cover window including a light shielding pattern disposed in a peripheral area. The light shielding pattern may be spaced apart from the display area when viewed from a plan view, and the light shielding pattern may partially overlap the first power line and the second power line.

In an embodiment, the display apparatus may further include a first via insulating layer disposed between the first conductive layer and the second conductive layer. In such an embodiment, the first via insulating layer may include an organic insulating material.

In an embodiment, the display apparatus may further include a spider line disposed in the peripheral area on the base substrate. The spider line may be disposed between the base substrate and at least one line selected from the first power line and the second power line.

In an embodiment, the spider line may include a first layer spider line and a second layer spider line. In such an embodiment, the display apparatus may further include an insulating layer disposed between the first layer spider line and the second layer spider line.

In an embodiment, the display apparatus may further include an active pattern disposed on the base substrate in the display area, a gate electrode overlapping the active pattern, and a storage electrode overlapping the gate electrode. In such an embodiment, the first conductive layer may further include a source electrode and a drain electrode, which are electrically connected to the active pattern. In such an embodiment, the second conductive layer may further include a second contact pad. In such an embodiment, the display apparatus may further include a pixel electrode disposed in the display area and electrically connected to the contact pad, a light emitting layer on the pixel electrode, and an opposite electrode disposed on the light emitting layer.

According to an embodiment of the invention, a display apparatus includes a base substrate including a display area and a peripheral area, which is a non-display area and disposed adjacent to the display area, a light emitting structure disposed on the base substrate in the display area, a first power line disposed on the base substrate in the peripheral area, where the first power line supplies a first power voltage to the light emitting structure, a second power line disposed in the peripheral area on the base substrate, where the second power line supplies a second power voltage to the light emitting structure, and an electrode which at least partially overlaps the first power line and the second power line.

In an embodiment, the electrode may be floated.

In an embodiment, the light emitting structure may include a pixel electrode, a light emitting layer on the pixel electrode, and an opposite electrode on the light emitting layer.

In such an embodiment, the electrode may be disposed in a same layer as the pixel electrode and include a same material as the pixel electrode.

In an embodiment, the first power line may include a first layer portion and a second layer portion overlapping and electrically connected to the first layer portion. In such an embodiment, the second power line may include a first layer portion and a second layer portion overlapping and electrically connected to the first layer portion. In such an embodiment, the first layer portion of the first power line and the first layer portion of the second power line may be defined by a first conductive layer and may include a same material as each other. In such an embodiment, the second layer portion of the first power line and the second layer portion of the second power line may be defined by a second conductive layer and may include a same material as each other.

In an embodiment, the electrode may be defined by the first conductive layer or the second conductive layer.

In an embodiment, the electrode may be defined by the second conductive layer and may partially overlap the first layer portion of the first power line and the first layer portion of the second power line, or the electrode may be defined by the first conductive layer and may partially overlap the second layer portion of the first power line and the second layer portion of the second power line.

In an embodiment, the display apparatus may further include a cover window including a light shielding pattern disposed in the peripheral area. In such an embodiment, the light shielding pattern may be spaced apart from the display area when viewed from a plan view, and the light shielding pattern may partially overlap the first power line and the second power line.

In an embodiment, the display apparatus may further include a spider line disposed in the peripheral area on the base substrate. In such an embodiment, the spider line may be disposed between the base substrate and at least one line selected from the first power line and the second power line.

In an embodiment, the spider line may include a first layer spider line and a second layer spider line. In such an embodiment, the display apparatus may further include an insulating layer disposed between the first layer spider line and the second layer spider line.

According to embodiments of the invention, a display apparatus includes a first power line and a second power line. In such embodiments, the first power line and the second power line of the display apparatus are adjacent to a display area, and in a peripheral area which is not covered by a light shielding pattern, the first power line and the second power line may overlap each other or covered by a cover electrode. Accordingly, display quality may be improved by reducing wiring unevenness which may be recognized due to external light reflection, and a bending area BA may be bent to minimize the non-display area, thereby providing a display apparatus in which the display area is enlarged.

BRIEF DESCRIPTION OF THE DRAWINGS

The above and other features of the invention will become more apparent by describing in detail exemplary embodiments thereof with reference to the accompanying drawings, in which.

DETAILED DESCRIPTION

Figure 1:
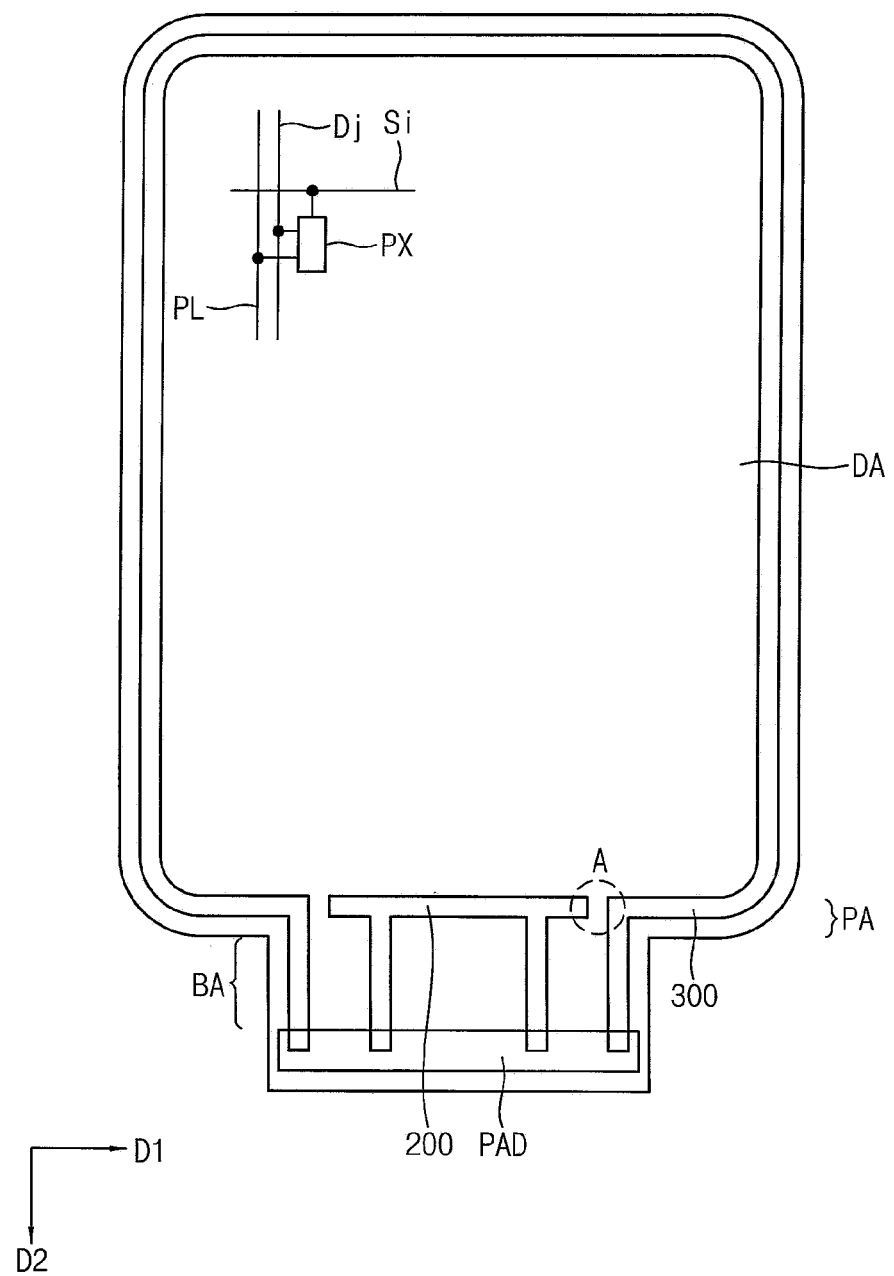
FIG. 1 is a plan view illustrating a display apparatus according to an exemplary embodiment of the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Hereinafter, embodiments of the invention will be described in detail with reference to the accompanying drawings.

FIG. 1 is a plan view illustrating a display apparatus according to an exemplary embodiment of the invention.

Referring to FIG. 1, an embodiment of the display apparatus may include a display area DA in which an image is displayed, and a peripheral area PA that is a non-display area surrounding the display area DA.

The display apparatus may include a first power line 200, a second power line 300, and a pad PAD disposed in the peripheral area PA. The peripheral area PA may include a bending area BA. The peripheral area PA may include a bending area BA.

The display apparatus may include a scan line Si, a data line Dj, a voltage line PL, and a pixel PX disposed in the display area DA. Each of the scan line Si, the data line Dj, the voltage line PL, and the pixel PX may be provided in plural.

The scan line Sj may extend in a first direction D1. The data line Dj may extend in a second direction D2 that crosses the first direction D1. The driving voltage line PL may extend in the second direction D2 and may be electrically connected to the first power line 200.

The pixel PX may be electrically connected to the scan line Sj, the data line Dj, and the driving voltage line PL.

In an embodiment, the pixel PX may include a self-luminous element. In such an embodiment, the self-luminous element may include at least one selected from an organic light emitting diode, a quantum dot light emitting diode, and an inorganic ultra-small light emitting diode (e.g., a micro LED). Hereinafter, for ease of description, embodiments in which the self-luminous element is an organic light emitting diode will be described in detail.

In an embodiment, the pixel PX may emit one of a red light, a green light and a blue light. However, the invention is not limited thereto. In one embodiment, for example, the pixel PX may emit light of a predetermined color such as cyan, magenta, yellow, or white.

The pixel PX will be described in greater detail later.

Figure 2:
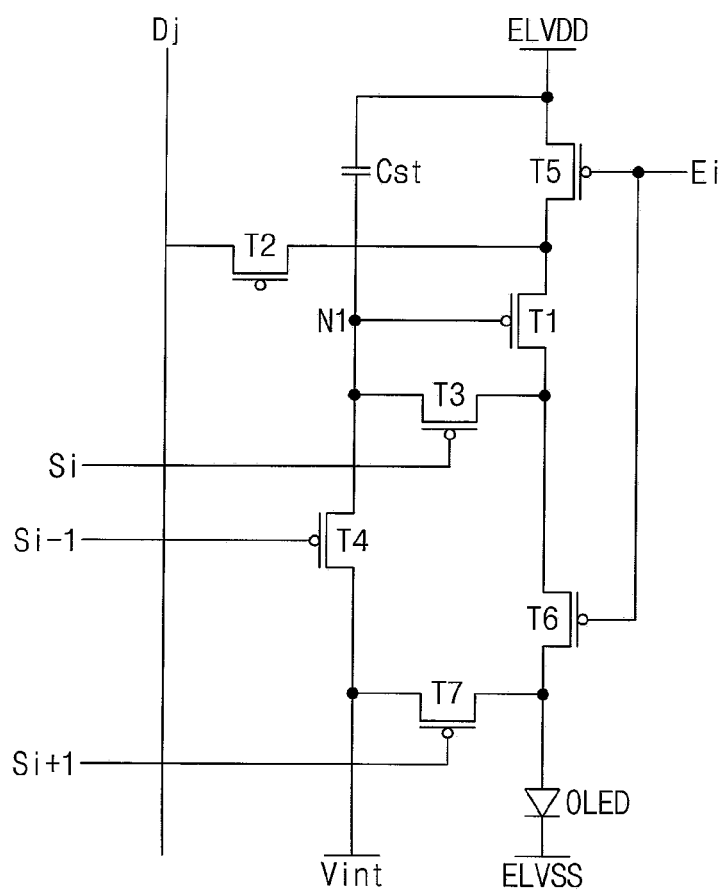
FIG. 2 is an equivalent circuit diagram illustrating an exemplary embodiment of a pixel shown in FIG. 1.

The first power line 200 may be electrically connected to the driving voltage line PL to supply a first power voltage, which is a driving voltage ELVDD shown in FIG. 2, to the pixel PX.

The second power line 300 may provide a second power voltage, which is a common voltage ELVSS shown in FIG. 2, to the pixel PX. In an embodiment, the second power line 300 is electrically connected to an opposite electrode 183, which is a cathode electrode, in the peripheral area PA (see FIG. 6). Thus, the common voltage may be provided to the opposite electrode 183.

The second power line 300 may be arranged to at least partially surround the peripheral area PA. In an embodiment, the second power line 300 may be arranged to surround the display area DA, as shown in FIG. 1.

The display apparatus may be bent in the bending area BA so that the pad may be disposed on the rear surface of the display area DA. The area of the non-display area that is visually recognized by the user may be reduced by bending a portion of the peripheral area PA to face the rear surface of the display apparatus.

FIG. 2 is an equivalent circuit diagram illustrating an exemplary embodiment of a pixel shown in FIG. 1. In FIG. 2, a pixel PX connected to a j-th data line Dj, an (i−1)-th scan line Si−1, an i-th scan line Si, and an (i+1)-th scan line Si+1 is illustrated for ease of illustration and description.

Referring to FIG. 2, an embodiment of the pixel PX includes an organic light emitting diode OLED, a first transistor T1, a second transistor T2, a third transistor T3, a fourth transistor T4, a fifth transistor T5, a sixth transistor T6, a seventh transistor T7, and a storage capacitor Cst.

An anode of the organic light emitting diode OLED may be connected to the first transistor T1 via the sixth transistor T6, and a cathode of the organic light emitting diode OLED may be connected to a common power source to which a common voltage ELVSS is provided. The organic light emitting diode OLED may generate light having a luminance level corresponding to an amount of a current supplied from the first transistor T1.

A driving voltage ELVDD may be a voltage higher than the common voltage ELVSS such that a current is allowed to flow through the organic light emitting diode OLED. Here, the driving voltage ELVDD is also referred to as a first power voltage, and the common voltage ELVSS is also referred to as a second power voltage.

The seventh transistor T7 is connected between an initialization power source provided with an initialization voltage Vint and the anode of the organic light emitting diode OLED. A gate electrode of the seventh transistor T7 is connected to the (i+1)-th scan line Si+1. The seventh transistor T7 is turned on when a scan signal is transmitted to the (i+1)-th scan line Si+1 to supply the initialization voltage Vint to the anode of the organic light emitting diode OLED. Here, the initialization voltage Vint may be a voltage lower than a data voltage provided to the j-th data line Dj.

The sixth transistor T6 is connected between the first transistor T1 and the organic light emitting diode OLED. A gate electrode of the sixth transistor T6 is connected to an i-th emission control wiring Ei. The sixth transistor T6 is turned off when an emission control signal is supplied to the i-th emission control wiring Ei and is turned on otherwise.

The fifth transistor T5 is connected between a driving power source provided with the driving voltage ELVDD and the first transistor T1. A gate electrode of the fifth transistor T5 is connected to the i-th emission control wiring Ei. The fifth transistor T5 is turned off when the emission control signal is supplied to the i-th emission control wiring Ei and is turned on otherwise.

A first electrode of the first transistor T1 (or a driving transistor) is connected to the driving power source, to which the driving voltage ELVDD is provided, via the fifth transistor T5, and a second electrode of the first transistor T1 is connected to the anode of the organic light emitting diode OLED via the sixth transistor T6. In addition, a gate electrode of the first transistor T1 is connected to a first node N1. The first transistor T1 controls an amount of a current, which flows from the driving power source provided with the driving voltage ELVDD to the common power source ELVSS via the organic light emitting diode OLED, based on the voltage of the first node N1.

The third transistor T3 is connected between the second electrode of the first transistor T1 and the first node N1. A gate electrode of the third transistor T3 is connected to the i-th scan line Si. The third transistor T3 is turned on when a scan signal is supplied to the i-th scan line Si to electrically connect the second electrode of the first transistor T1 and the first node N1. Therefore, when the third transistor T3 is turned on, the first transistor T1 is connected in a diode form.

The fourth transistor T4 is connected between the first node N1 and the initialization power source Vint. A gate electrode of the fourth transistor T4 is connected to the (i−1)-th scan line Si−1. The fourth transistor T4 is turned on when a scan signal is transmitted to the (i−1)-th scan line Si−1 to supply the voltage of the initialization power source Vint to the first node N1.

The second transistor T2 is connected between the j-th data line Dj and the first electrode of the first transistor T1. A gate electrode of the second transistor T2 is connected to the i-th scan line Si. The second transistor T2 is turned on when a scan signal is supplied to the i-th scan line Si to electrically connect the j-th data line Dj and the first electrode of the first transistor T1.

The storage capacitor Cst is connected between the driving power source provided with the driving voltage ELVDD and the first node N1. The storage capacitor Cst stores a voltage corresponding to the data voltage and a threshold voltage of the first transistor T1.

Figure 3:
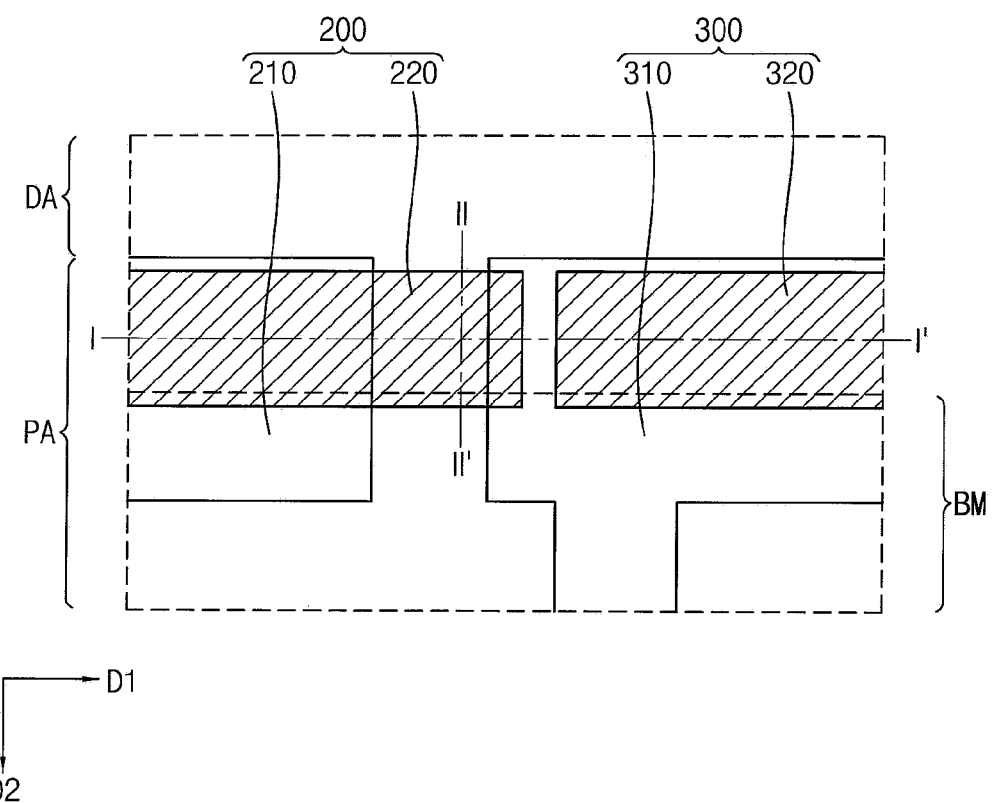
FIG. 3 is a partially enlarged view illustrating a first power line and a second power line in a portion A of FIG. 1.

FIG. 3 is a partially enlarged view illustrating a first power line and a second power line in a portion A of FIG. 1.

Referring to FIGS. 1 to 3, in an embodiment of a display apparatus, the first power line 200 may be disposed in the peripheral area PA. The first power line 200 may include a first layer portion 210 and a second layer portion 220 overlapping the first layer portion 210 and electrically connected to the first layer portion 210. The second power line 300 may include a first layer portion 320 and a second layer portion 310 overlapping and electrically connected to the first layer portion 320.

In such an embodiment, a portion of the first power line 200 and a portion of the second power line 300 overlap each other when viewed from a plan view in a direction perpendicular to the first and second direction D1 and D2 (or a thickness direction of the display apparatus. In the peripheral area PA adjacent to the display area DA, lower wires (e.g., spider line (see SPL of FIG. 4)) of the first power line 200 and the second power line 300 may be covered by the first power line 200 or the second power line 300.

In such an embodiment, the light shielding pattern BM is disposed in the peripheral area PA is disposed to be spaced apart from the display area DA, and is disposed to partially overlap the second layer portion 220 and the second layer portion 320 of the second power line 300. Therefore, the display apparatus may have a structure in which the lower wirings are not visible to the user in the peripheral area PA.

In such an embodiment, a problem of uneven visibility of the wiring due to a reflection of the lower wiring (spider line, etc.) is reduced, and the display quality may be improved.

In an embodiment, a first power voltage may be applied to the first power supply line 200, and a second power voltage different from the first power voltage is applied to the second power line 300. The first power line 200 and the second power line 300 are disposed to be spaced apart from each other, and electrically disconnected or insulated from each other.

If the first power line 200 and the second power line 300 are spaced apart on a same plane and the lower wires are not covered, the lower wires may be recognized as spots due to external light reflection. In particular, the peripheral area PA in which the first power line 200 and the second power line 300 are disposed is a portion very close to the display area DA and may not be covered by the light shielding pattern BM.

According to an embodiment of the invention, the first power line 200 and the second power line 300 of the display apparatus are adjacent to the display area DA, and the first power line 200 and the second power line 300 may overlap each other in the peripheral area which is not covered by the light shielding pattern BM. Accordingly, display quality may be improved by reducing wiring unevenness which may be recognized due to external light reflection, and the bending area BA may be bent to minimize the non-display area, thereby providing a display apparatus in which the display area DA is enlarged.

Figure 4:
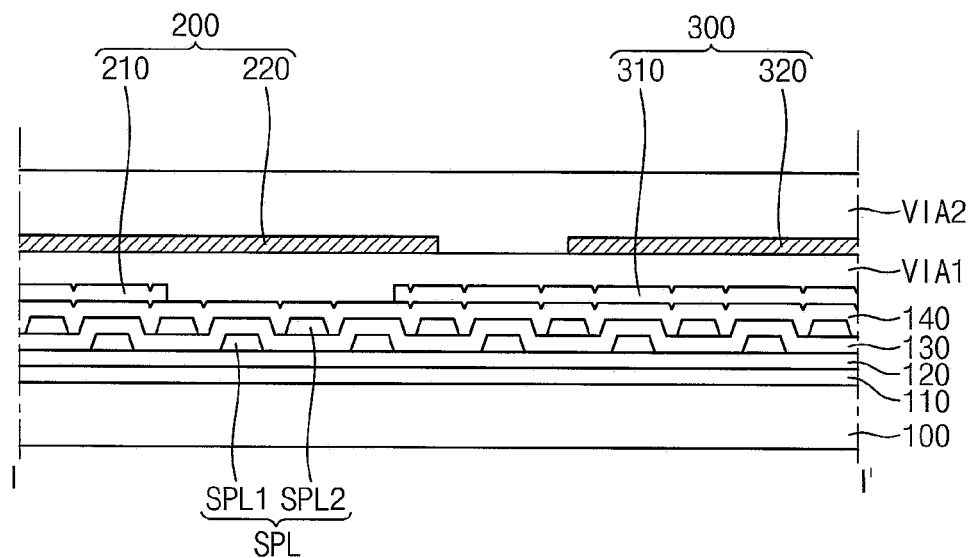
FIG. 4 is a cross-sectional view taken along the line I-I' of FIG. 3.
Figure 5:
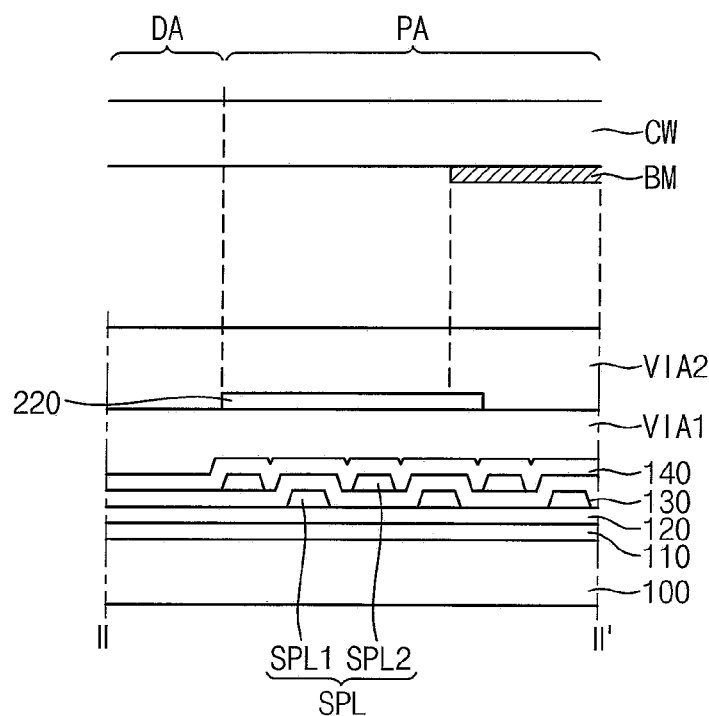
FIG. 5 is a cross-sectional view taken along the line II-II' of FIG. 3.
Figure 6:
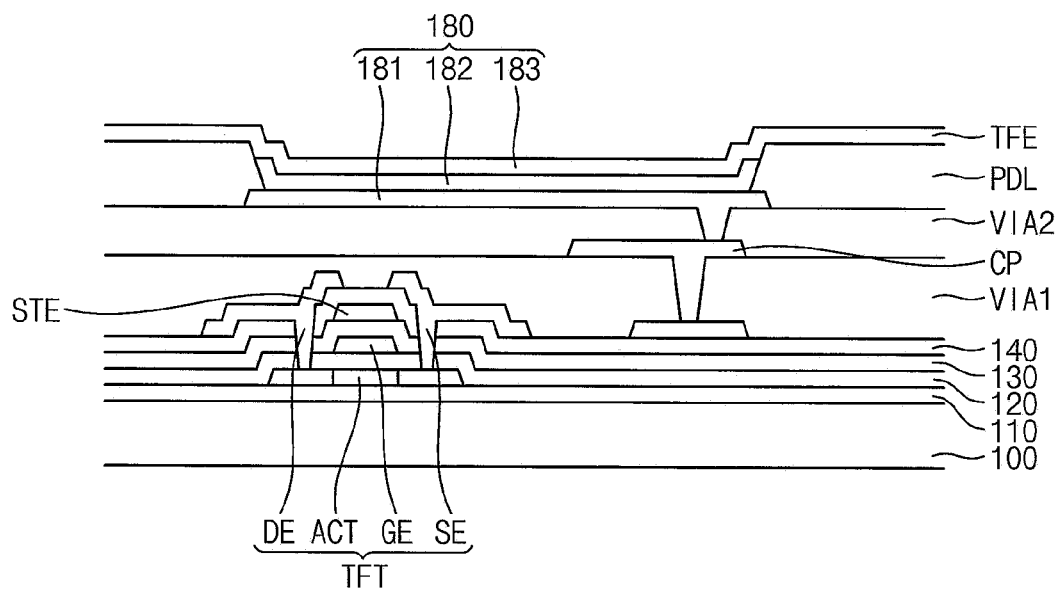
FIG. 6 is a cross-sectional view of a portion corresponding to a pixel of the display apparatus of FIG. 1.

FIG. 4 is a cross-sectional view taken along the line II' of FIG. 3. FIG. 5 is a cross-sectional view taken along the line II-II' of FIG. 3. FIG. 6 is a cross-sectional view of a portion corresponding to a pixel of the display apparatus of FIG. 1.

Referring to FIGS. 1 to 6, an embodiment of the display apparatus may include a base substrate 100, a buffer layer 110, an active layer, a first insulating layer 120, a first gate conductive layer, a second insulating layer 130, a second gate conductive layer, a third insulating layer 140, a first source drain conductive layer, a first via insulating layer VIA1, a second source drain conductive layer, a second via insulating layer VIA2, a pixel defining layer PDL, a light emitting structure 180, a thin film encapsulation layer TFE, and a cover window CW.

Referring again to FIGS. 4 and 5, the base substrate 100 including a transparent or opaque insulation material may be provided. In one embodiment, for example, the base substrate 100 may include a quartz substrate, a synthetic quartz substrate, a calcium fluoride substrate, a fluoride-doped quartz substrate, a sodalime glass substrate or a non-alkali glass substrate. Alternatively, the base substrate 100 may include a flexible transparent material such as a flexible transparent resin substrate (e.g., a polyimide substrate).

The buffer layer 110 may be disposed on the base substrate 100.

The first insulating layer 120 may be disposed on the buffer layer 110. The first insulating layer 120 may include an inorganic insulating material. In one embodiment, for example, the first insulating layer 120 may include a silicon compound, a metal oxide, or the like. The first insulating layer 120 may be formed of a plurality of layers or have a multi-layer structure.

The first gate conductive layer may be disposed on the first insulating layer 120. The first gate conductive layer may include a first layer spider line SPL1. The first gate conductive layer may be formed using a metal, an alloy, a metal nitride, a conductive metal oxide, a transparent conductive material, or the like.

The second insulating layer 130 may be disposed on the first insulating layer 120 on which the first gate conductive layer is disposed. The second insulating layer 130 may include an inorganic insulating material. In one embodiment, for example, the second insulating layer 130 may include a silicon compound, a metal oxide, or the like. The second insulating layer 130 may be formed of a plurality of layers or have a multi-layer structure. The second insulating layer 130 may cover the first gate conductive layer on the first insulating layer 120, and may be disposed to have substantially a constant or uniform thickness along the profile of the first gate conductive layer.

The second gate conductive layer may be disposed on the second insulating layer 130. The second gate conductive layer may include a second layer spider line SPL2. The second gate conductive layer may be formed using a metal, an alloy, a metal nitride, a conductive metal oxide, a transparent conductive material, or the like.

The first layer spider line SPL1 and the second layer spider line SPL2 may be alternately arranged with each other in a plan view, and spread (fan-out) in a direction opposite to the second direction D2 to form a spider line SPL. The spider line SPL may be a signal wire for transferring a signal from the pad to the pixel PX.

The third insulating layer 140 may be disposed on the second insulating layer 130 on which the second gate conductive layer is disposed. The third insulating layer 140 may include an inorganic insulating material or an organic insulating material. The third insulating layer 140 may be formed of a plurality of layers or have a multi-layer structure.

The first source drain conductive layer may be disposed on the third insulating layer 140. The first source drain conductive layer may include the first layer portion 210 of the first power line 200 and the first layer portion 310 of the second power line 300. The first layer portion 210 of the first power line 200 and the first layer portion 310 of the second power line 300 may be spaced apart from each other. The first source drain conductive layer may be formed using a metal, an alloy, a metal nitride, a conductive metal oxide, a transparent conductive material, or the like.

The first via insulation layer VIA1 may be disposed on the third insulating layer 140 on which the first source drain conductive layer is disposed. The first via insulation layer VIA1 may have a single-layered structure or a multi-layered structure including at least two insulation films. The first via insulation layer VIA1 may be formed using an organic material. In one embodiment, for example, the first via insulation layer VIA1 may include at least one material selected from a photoresist, an acryl-based resin, a polyimide-based resin, a polyamide-based resin, a siloxane-based resin, and a combination thereof. In an embodiment, the first via insulation layer VIA1 may include an inorganic material such as a silicon compound, a metal oxide, etc.

The second source drain conductive layer may be disposed on the first via insulating layer VIAL The second source drain conductive layer may include the second layer portion 220 of the first power line 200 and the second layer portion 320 of the second power line 300. The second layer portion 220 of the first power line 200 and the second layer portion 320 of the second power line 300 may be spaced apart from each other. The second source drain conductive layer may be formed using a metal, an alloy, a metal nitride, a conductive metal oxide, a transparent conductive material, or the like.

The second via insulating layer VIA2 may be disposed on the first via insulating layer VIA1 on which the second source drain conductive layer is disposed. The second via insulating layer VIA2 may have a single-layered structure or a multi-layered structure including at least two insulation films. The second via insulating layer VIA2 may be formed using an organic material. In one embodiment, for example, the second via insulating layer VIA2 may include at least one material selected from a photoresist, an acryl-based resin, a polyimide-based resin, a polyamide-based resin, a siloxane-based resin, and a combination thereof. In an embodiment, the second via insulating layer VIA2 may include an inorganic material such as a silicon compound, metal oxide, etc.

Although not shown, the second layer portion 220 of the first power line 200 may be connected to the first layer portion 210 of the first power line 200 through a contact hole defined through the first via insulating layer VIAL The second layer portion 320 of the second power line 300 may be connected to the first layer portion 310 of the second power line 300 through a contact hole defined through the first via insulating layer VIA'.

In an embodiment, a portion of the second layer portion 220 of the first power line 200 may be disposed to overlap a portion of the first layer portion 310 of the second power line 300. In such an embodiment, since the first power line 200 and the second power line 300 may be spaced apart from each other in a plan view, the spider line SPL, which is a lower wiring of the first power line 200 and the second power line 300, may not be exposed. Accordingly, the unevenness of wiring which may be recognized due to a reflection of external light by the spider line SPL may not be recognized by the user, and the display quality may be improved.

The cover window CW may be disposed on the second via insulating layer VIA2 and the thin film encapsulation layer TFE, and may include a light shielding pattern BM. The light shielding pattern BM may be disposed in the peripheral area PA. The light shielding pattern BM may be spaced apart from the display area DA and partially overlap the first power line 200 and the second power line 300. Therefore, the lower wirings may be covered so that the lower wiring such as the spider wiring SPL is not visible.

Referring to FIG. 6, in the display area DA, the buffer layer 110 may be disposed on the base substrate 100.

The buffer layer 110 may be disposed on the entire substrate 100 in the display area DA. The buffer layer 110 may effectively prevent the diffusion of metal atoms and/or impurities from the substrate 100 into the active layer. In such an embodiment, the buffer layer 110 may control a rate of a heat transfer in a crystallization process for forming the active layer thereby obtaining substantially uniform the active layer.

The active layer may be disposed on the buffer layer 110. The active layer may include an amorphous silicon or a poly crystal silicon. In an embodiment, the active layer may include an oxide of at least one material selected from indium (In), gallium (Ga), stanium (Sn), zirconium (Zr), vanadium (V), hafnium (Hf), cadmium (Cd), and germanium (Ge), chromium (Cr), titanium (Ti) and zinc (Zn). The active layer may include drain and source regions doped with an impurity and a channel region between the drain region and the source region.

The first insulating layer 120 may be disposed on the buffer layer 110 and the active layer on the buffer layer 110. The first insulating layer 120 covers the active layer on the buffer layer 110 and may be disposed to have substantially a constant or uniform thickness along the profile of the active layer.

The first gate conductive layer may be disposed on the first insulating layer 120. The first gate conductive layer may further include a gate electrode GE of a thin film transistor TFT. The gate electrode GE may be disposed to overlap the channel region of the active layer The second insulating layer 130 may be disposed on the first insulating layer 120 on which the first gate conductive layer is disposed.

The second gate conductive layer may be disposed on the second insulating layer 130. The second gate conductive layer may further include a storage electrode STE. The storage electrode STE may overlap the gate electrode GE to form a storage capacitor Cst together with the second insulating layer 130 therebetween.

The third insulating layer 140 may be disposed on the second insulating layer 130 and the second gate conductive layer on the second insulating layer 130.

The first source drain conductive layer may be disposed on the third insulating layer 140. The first source drain conductive layer may include a source electrode SE and a drain electrode DE of the thin film transistor TFT.

The first via insulating layer VIA1 may be disposed on the third insulating layer 140 on which the first source drain conductive layer is disposed.

The second source drain conductive layer may be disposed on the first via insulating layer VIAL The second source drain conductive layer may further include a contact pad CP.

The second via insulating layer VIA2 may be disposed on the first via insulating layer VIA1 on which the second source drain conductive layer is disposed.

The light emitting structure 180 may include a pixel electrode 181, a light emitting layer 182 and an opposite electrode 183.

The pixel electrode 181 may be disposed on the second via insulation layer VIA2. The pixel electrode 181 may include a reflective material or a transmissive material in accordance with the emission type of the display apparatus. In one embodiment, for example, the pixel electrode 181 may include a transmissive material or a reflective material in accordance with the emission type of the display device. In one embodiment, for example, the pixel electrode 181 may include at least one material selected from aluminum, an alloy containing aluminum, aluminum nitride, silver, an alloy containing silver, tungsten, tungsten nitride, copper, an alloy containing copper, nickel, chromium, chromium nitride, molybdenum, alloys containing titanium, titanium nitride, platinum, tantalum, tantalum nitride, neodymium, scandium, strontium ruthenium oxide, zinc oxide, indium tin oxide, tin oxide, indium oxide, gallium oxide, indium zinc oxide and the like. In an embodiment, the pixel electrode 181 may have a single layer structure or a multi-layer structure, which may include a metal film, an alloy film, a metal nitride film, a conductive metal oxide film and/or a transparent conductive film.

The pixel defining layer PDL may be disposed on the second via insulation layer VIA2 on which the pixel electrode 181 is disposed. The pixel defining layer PDL may be formed using an organic material. In one embodiment, for example, the pixel defining layer PDL may include at least one material selected from a photoresist, an acryl-based resin, a polyimide-based resin, a polyamide-based resin, a siloxane-based resin, and a combination thereof. In an embodiment, an opening which exposes the pixel electrode 181 may be formed by etching the pixel defining layer PDL. An emitting area and a non-emitting area of the display apparatus may be defined by the opening of the pixel defining layer PDL. In one embodiment, for example, a portion where the opening of the pixel defining layer PDL is located may correspond to an emitting area, and a non-emitting area may correspond to a portion adjacent to the opening of the pixel defining layer PDL.

The light emitting layer 182 may be disposed on the pixel electrode 181 exposed through the opening of the pixel defining layer PDL. In an embodiment, the light emitting layer 182 may extend on a sidewall of the opening of the pixel defining layer PDL. In an embodiment, the light emitting layer 182 may include an organic light emitting layer, a hole injection layer, a hole transfer layer, an electron transfer layer, an electron injection layer, etc. In one embodiment, for example, the layers of the light emitting layer 182, except for the organic emission layer, the hole injection layer, that is, the hole transport layer, the electron transport layer and the electron injection layer, may be formed in common to correspond to a plurality of pixels. In an embodiment, a plurality of organic light emitting layers may be formed using light emitting materials for generating light of different colors such as a red light, a green light and a blue light in accordance with color pixels of the display device. In an embodiment, the organic light emitting layer of the of the light emitting layer 182 may include a plurality of stacked light emitting materials for generating a red light, a green light and a blue light to thereby emitting a white light. Here, elements of the light emitting layer 182 are commonly formed to correspond to a plurality of pixels, and each pixel may be divided or defined by a color filter layer.

The opposite electrode 183 may be disposed on the pixel defining layer PDL and the light emitting layer 182. The opposite electrode 183 may include a transmissive material or a reflective material in accordance with the emission type of the display device. In one embodiment, for example, the opposite electrode 183 may include at least one material selected from aluminum, an alloy containing aluminum, aluminum nitride, silver, an alloy containing silver, tungsten, tungsten nitride, copper, an alloy containing copper, nickel, chromium, chromium nitride, molybdenum, alloys containing titanium, titanium nitride, platinum, tantalum, tantalum nitride, neodymium, scandium, strontium ruthenium oxide, zinc oxide, indium tin oxide, tin oxide, indium oxide, gallium oxide, indium Zinc oxide and a combination thereof. In an embodiment, the opposite electrode 183 may also have a single layer structure or a multi-layer structure, which may include a metal film, an alloy film, a metal nitride film, a conductive metal oxide film and/or a transparent conductive film.

The thin film encapsulation layer TFE may be disposed on the opposite electrode 183. The thin film encapsulation layer TFE may prevent penetration of moisture and oxygen from outside. The thin film encapsulation layer TFE may include an organic layer and an inorganic layer. The organic layer and inorganic layer may be alternately and repeatedly stacked one on another. In one embodiment, for example, the thin film encapsulation layer TFE may include a first inorganic layer, a second inorganic layer, and an organic layer between the first inorganic layer and the second inorganic layer, but not being limited thereto. In an embodiment, a sealing substrate for shielding outside air and moisture from penetrating into the display apparatus may be provided instead of the thin film encapsulation layer TFE.

Although not shown in FIG. 6, the cover window CW may be disposed on the thin film encapsulation layer TFE.

Figure 7:
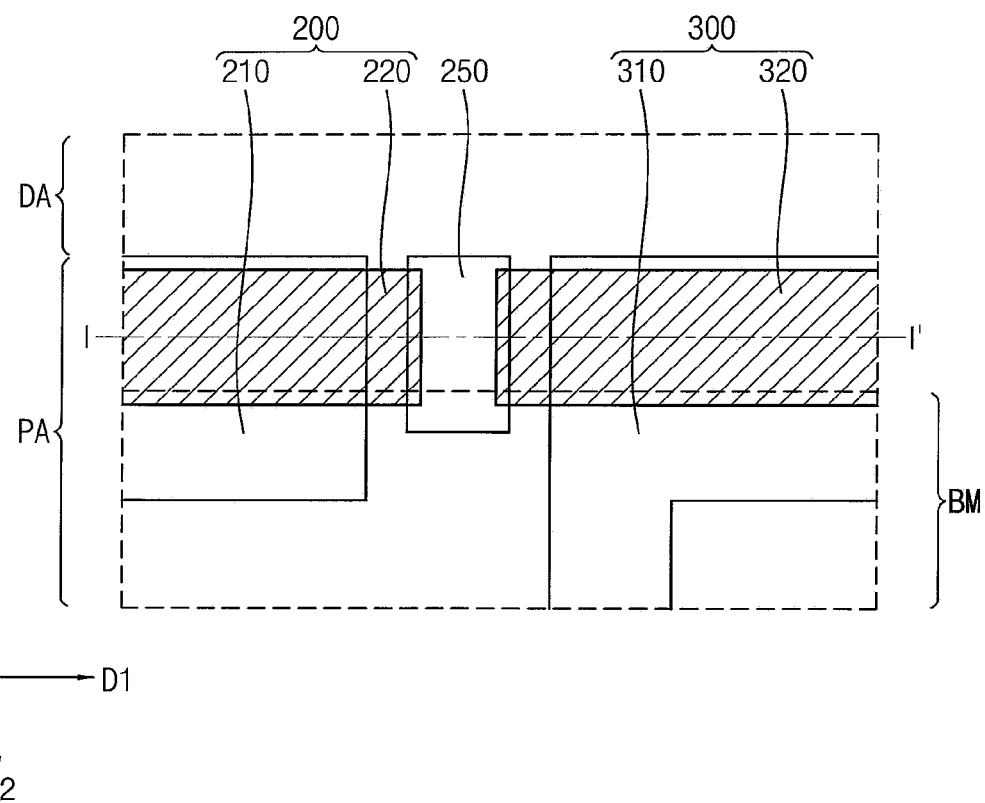
FIG. 7 is a partially enlarged view of a display apparatus according to an alternative exemplary embodiment of the invention.
Figure 8:
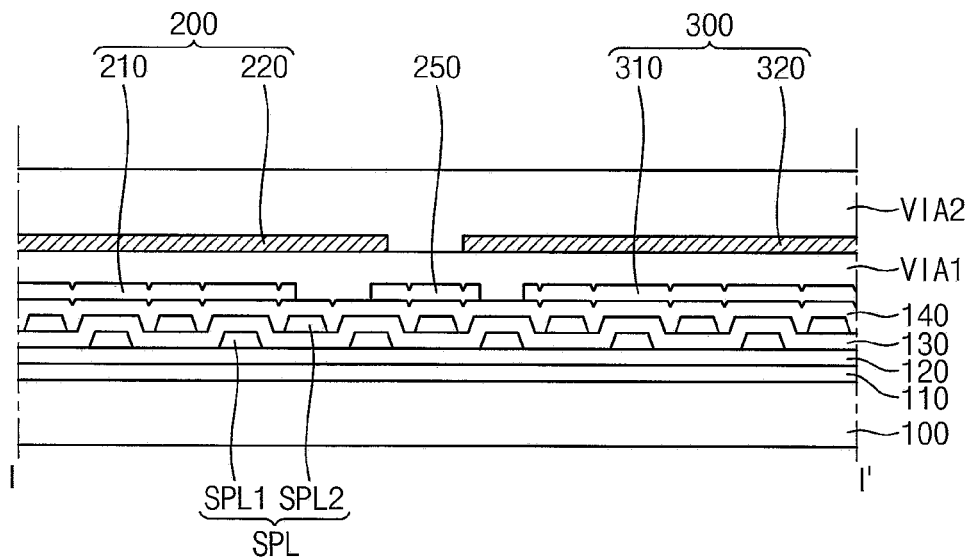
FIG. 8 is a cross-sectional view taken along line I-I' of FIG. 7.

FIG. 7 is a partially enlarged view of a display apparatus according to an alternative exemplary embodiment of the invention. FIG. 8 is a cross-sectional view taken along line I-I' of FIG. 7.

Referring to FIGS. 7 and 8, the display apparatus is substantially the same as the display apparatus of FIGS. 1 to 6 except for an overlapping structure of a first power line 200 and a second power line 300 in a peripheral area PA. The same or like elements shown in FIGS. 7 and 8 have been labeled with the same reference characters as used above to describe the embodiments of the display apparatus described above with reference to FIGS. 1 to 6, and any repetitive detailed description thereof will hereinafter be omitted or simplified.

In an embodiment, the display apparatus may include the base substrate 100, the buffer layer 110, the first insulating layer 120, the first gate conductive layer, the second insulating layer 130, the second gate conductive layer, the third insulating layer 140, a first source drain conductive layer, a first via insulating layer VIA1, a second source drain conductive layer, and a second via insulating layer VIA2.

The buffer layer 110 may be disposed on the base substrate 100. The first insulating layer 120 may be disposed on the buffer layer 110.

The first gate conductive layer may be disposed on the first insulating layer 120. The first gate conductive layer may include a first layer spider line SPL1.

The second insulating layer 130 may be disposed on the first insulating layer 120 on which the first gate conductive layer is disposed.

The second gate conductive layer may be disposed on the second insulating layer 130. The second gate conductive layer may include a second layer spider line SPL2.

The first layer spider line SPL1 and the second layer spider line SPL2 may be alternately arranged with each other in a plan view, and spread (fan-out) in a direction opposite to the second direction D2 to form a spider line SPL.

The third insulating layer 140 may be disposed on the second insulating layer 130 on which the second gate conductive layer is disposed.

The first source drain conductive layer may be disposed on the third insulating layer 140. The first source drain conductive layer may include a first layer portion 210 of the first power line 200, the electrode 250 and a first layer portion 310 of the second power line 300.

The first via insulating layer VIA1 may be disposed on the third insulating layer 140 on which the first source drain conductive layer is disposed.

The second source drain conductive layer may be disposed on the first via insulating layer VIAL The second source drain conductive layer may include a second layer portion 220 of the first power line 200 and a second layer portion 320 of the second power line 300.

In such an embodiment, the electrode 250 may partially overlap the second layer portion 220 of the first power line 200 and the second layer portion 320 of the second power line 300. The electrode 250 may be floated or in a floating state.

The second via insulating layer VIA2 may be disposed on the first via insulating layer VIA1 on which the second source drain conductive layer is disposed.

Figure 9:
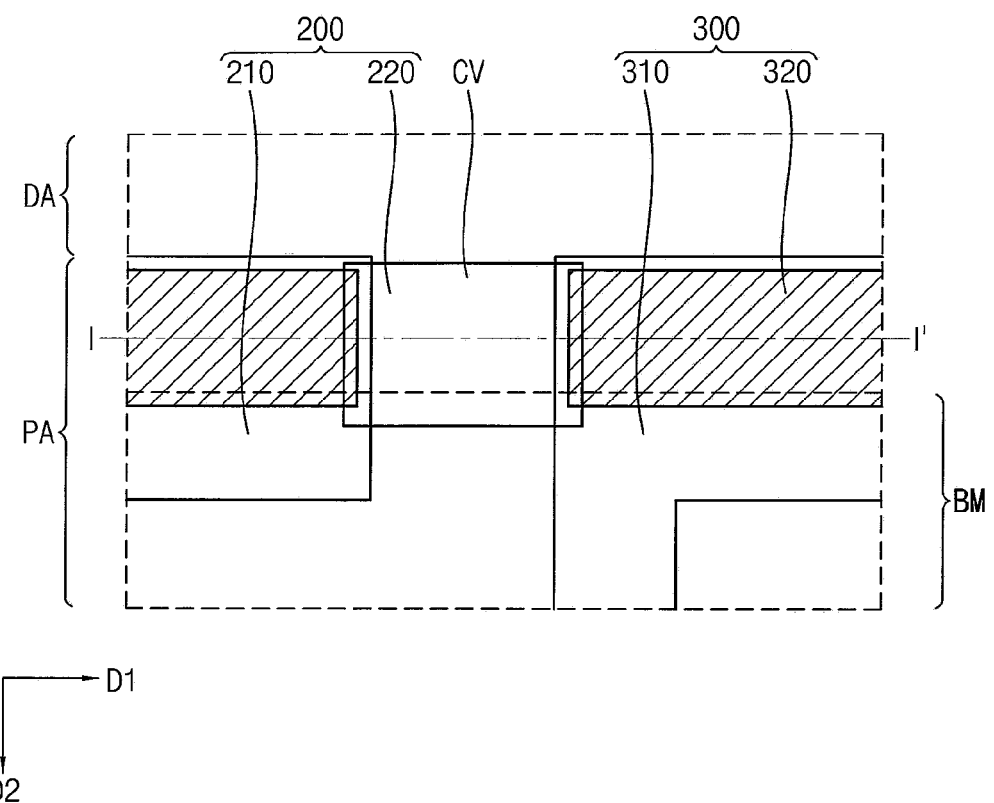
FIG. 9 is a partially enlarged view of a display apparatus according to another alternative exemplary embodiment of the invention.
Figure 10:
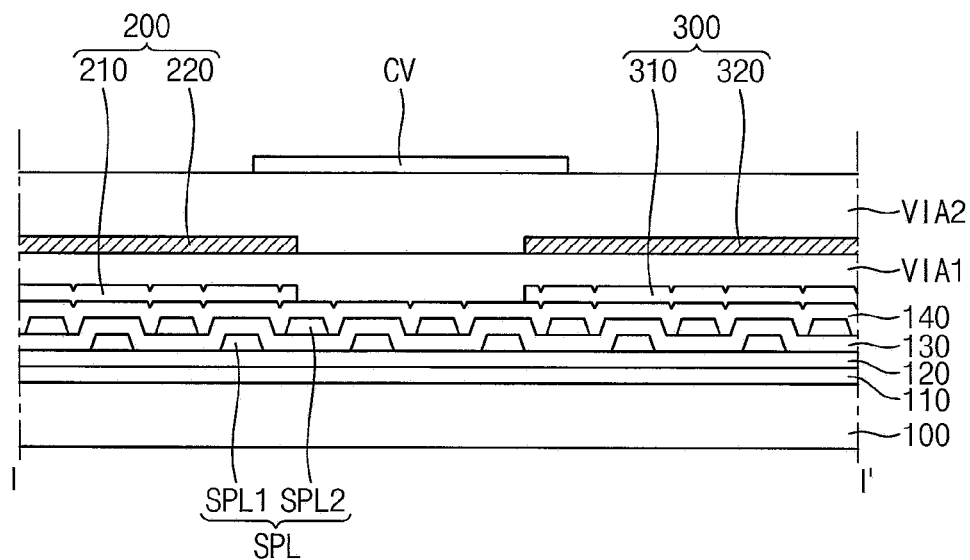
FIG. 10 is a cross-sectional view taken along line I-I' of FIG. 9.

FIG. 9 is a partially enlarged view of a display apparatus according to another alternative exemplary embodiment of the invention. FIG. 10 is a cross-sectional view taken along line I-I' of FIG. 9.

Referring to FIGS. 9 and 10, the display apparatus is substantially the same as the display apparatus of FIGS. 1 to 6 except for an overlapping structure of a first power line 200 and a second power line 300 in the peripheral area PA. The same or like elements shown in FIGS. 9 and 10 have been labeled with the same reference characters as used above to describe the embodiments of the display apparatus described above with reference to FIGS. 1 to 6, and any repetitive detailed description thereof will hereinafter be omitted or simplified.

In an embodiment, the display apparatus may include a base substrate 100, a buffer layer 110, a first insulating layer 120, a first gate conductive layer, a second insulating layer 130, a second gate conductive layer, a third insulating layer 140, a first source drain conductive layer, a first via insulating layer VIA1, a second source drain conductive layer, a second via insulating layer VIA2, and a cover electrode CV.

The buffer layer 110 may be disposed on the base substrate 100. The first insulating layer 120 may be disposed on the buffer layer 110.

The first gate conductive layer may be disposed on the first insulating layer 120. The first gate conductive layer may include a first layer spider line SPL1.

The second insulating layer 130 may be disposed on the first insulating layer 120 on which the first gate conductive layer is disposed.

The second gate conductive layer may be disposed on the second insulating layer 130. The second gate conductive layer may include a second layer spider line SPL2.

The first layer spider line SPL1 and the second layer spider line SPL2 may be alternately arranged with each other in a plan view, and spread (fan-out) in the opposite direction of the second direction D2 to for a spider line SPL.

The third insulating layer 140 may be disposed on the second insulating layer 130 on which the second gate conductive layer is disposed.

The first source drain conductive layer may be disposed on the third insulating layer 140. The first source drain conductive layer may include a first layer portion 210 of the first power line 200, and a first layer portion 310 of the second power line 300.

The first via insulating layer VIA1 may be disposed on the third insulating layer 140 on which the first source drain conductive layer is disposed.

The second source drain conductive layer may be disposed on the first via insulating layer VIAL The second source drain conductive layer may include a second layer portion 220 of the first power line 200 and a second layer portion 320 of the second power line 300.

The second via insulating layer VIA2 may be disposed on the first via insulating layer VIA1 on which the second source drain conductive layer is disposed.

The cover electrode CV may be disposed on the second via insulating layer VIA2. The cover electrode CV may be disposed on a portion in which the first layer portion 210 of the first power line 200 and the first layer portion 310 of the second power line 300 are spaced apart from each other. The cover electrode CV may partially overlap the second layer portion 220 of the first power line 200 and the second layer portion 320 of the second power line 300.

The cover electrode CV may be disposed in a same layer as the pixel electrode (see 181 of FIG. 6) and may include a same material as the pixel electrode.

Figure 11:
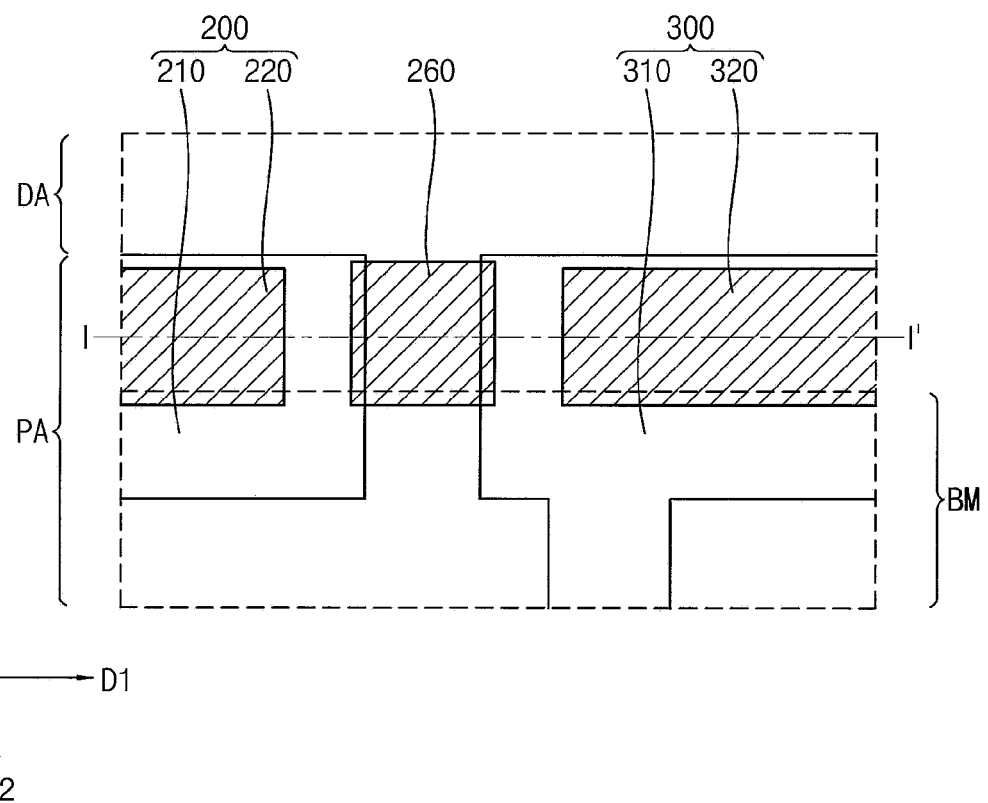
FIG. 11 is a partially enlarged view of a display apparatus according to another alternative exemplary embodiment of the invention.
Figure 12:
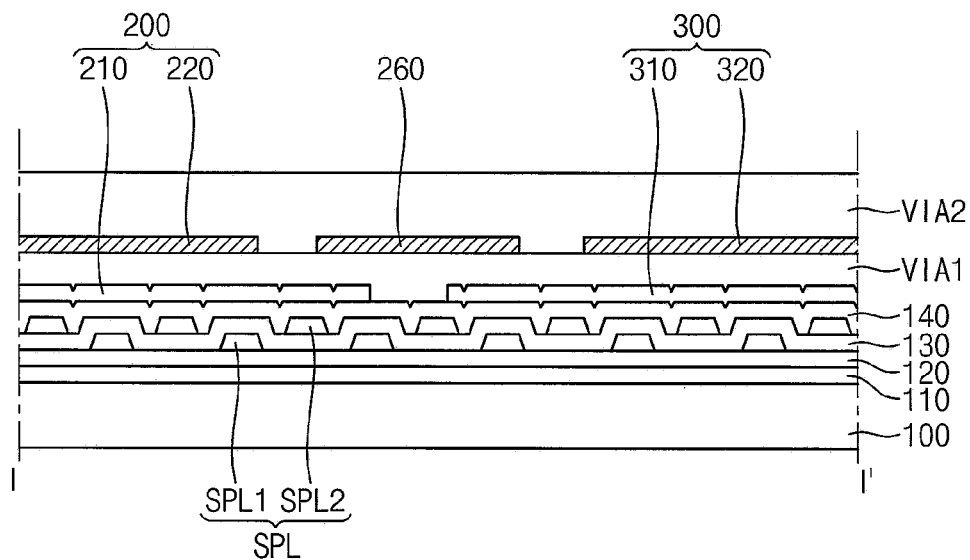
FIG. 12 is a cross-sectional view taken along line I-I' of FIG. 11.

FIG. 11 is a partially enlarged view of a display apparatus according to another alternative exemplary embodiment of the invention. FIG. 12 is a cross-sectional view taken along line I-I' of FIG. 11.

Referring to FIGS. 11 and 12, the display apparatus is substantially the same as the display apparatus of FIGS. 1 to 6 except for an overlapping structure of a first power line 200 and a second power line 300 in a peripheral area PA. The same or like elements shown in FIGS. 11 and 12 have been labeled with the same reference characters as used above to describe the embodiments of the display apparatus described above with reference to FIGS. 1 to 6, and any repetitive detailed description thereof will hereinafter be omitted or simplified.

The display apparatus may include a base substrate 100, a buffer layer 110, a first insulating layer 120, a first gate conductive layer, a second insulating layer 130, a second gate conductive layer, a third insulating layer 140, a first source drain conductive layer, a first via insulating layer VIA1, a second source drain conductive layer, and a second via insulating layer VIA2.

The buffer layer 110 may be disposed on the base substrate 100. The first insulating layer 120 may be disposed on the buffer layer 110.

The first gate conductive layer may be disposed on the first insulating layer 120. The first gate conductive layer may include a first layer spider line SPL1.

The second insulating layer 130 may be disposed on the first insulating layer 120 on which the first gate conductive layer is disposed.

The second gate conductive layer may be disposed on the second insulating layer 130. The second gate conductive layer may include a second layer spider line SPL2.

The first layer spider line SPL1 and the second layer spider line SPL2 may be alternately arranged with each other in a plan view, and spread (fan-out) in a direction opposite to the second direction D2 to for a spider line SPL.

The third insulating layer 140 may be disposed on the second insulating layer 130 on which the second gate conductive layer is disposed.

The first source drain conductive layer may be disposed on the third insulating layer 140. The first source drain conductive layer may include a first layer portion 210 of the first power line 200 and a first layer portion 310 of the second power line 300.

The first via insulating layer VIA1 may be disposed on the third insulating layer 140 on which the first source drain conductive layer is disposed.

The second source drain conductive layer may be disposed on the first via insulating layer VIAL The second source drain conductive layer may include a second layer portion 220 of the first power line 200, an electrode 260, and a second layer portion 320 of the second power line 300.

Here, the electrode 260 may partially overlap the first layer portion 210 of the first power line 200 and the first layer portion 310 of the second power line 300. The electrode 260 may be floated or in a floating state.

The second via insulating layer VIA2 may be disposed on the first via insulating layer VIA1 on which the second source drain conductive layer is disposed.

Figure 13:
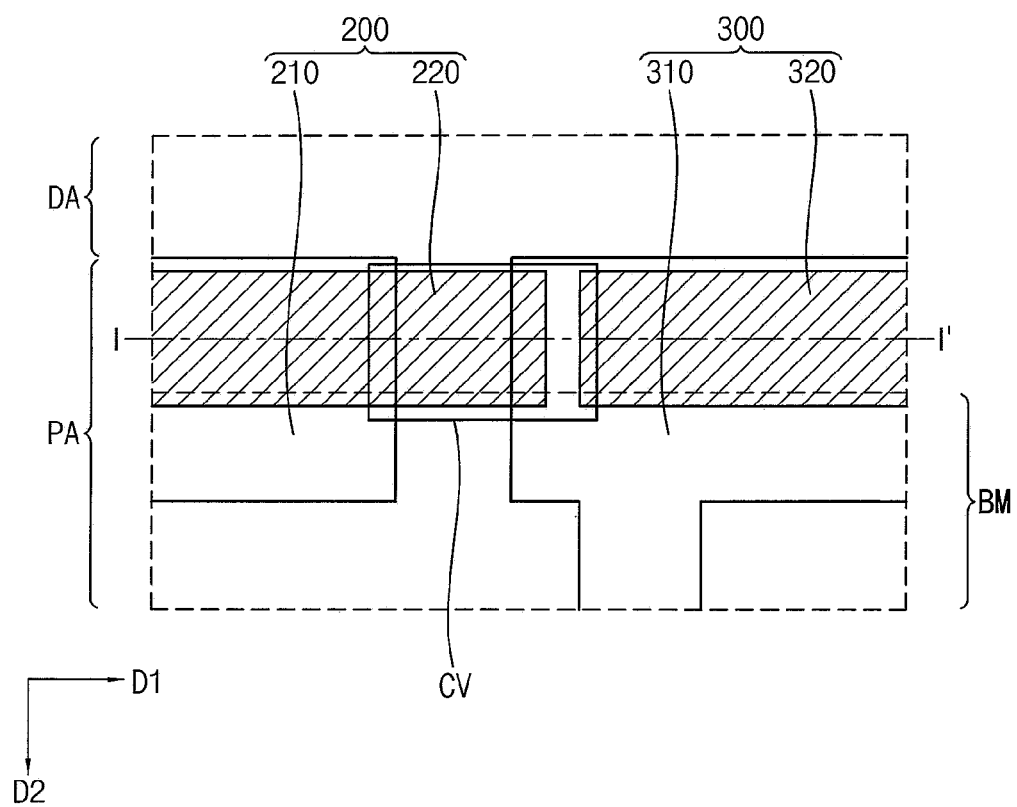
FIG. 13 is a partially enlarged view of a display apparatus according to another alternative exemplary embodiment of the invention.
Figure 14:
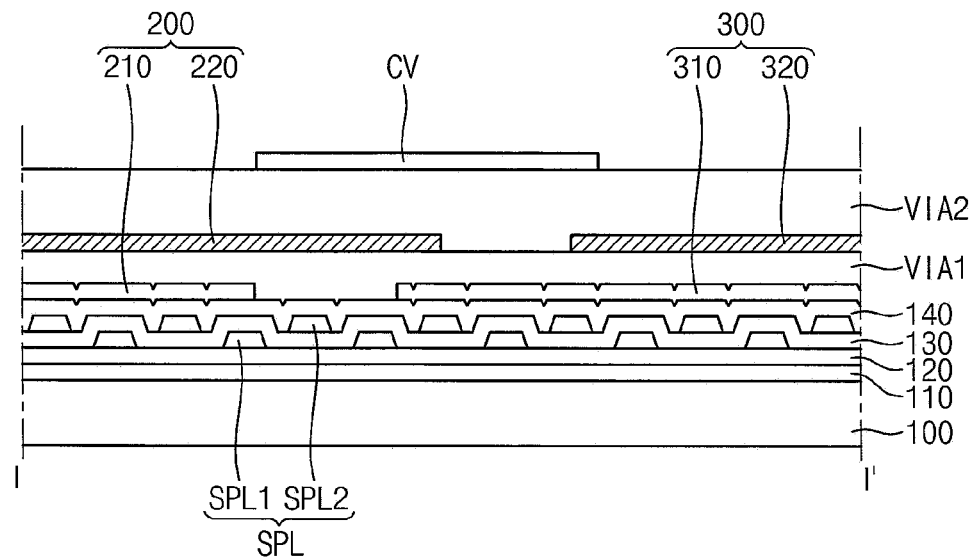
FIG. 14 is a cross-sectional view taken along line I-I' of FIG. 13.

FIG. 13 is a partially enlarged view of a display apparatus according to another alternative exemplary embodiment of the invention. FIG. 14 is a cross-sectional view taken along line I-I' of FIG. 13.

Referring to FIGS. 13 and 14, the display apparatus is substantially the same as the display apparatus of FIGS. 1 to 6 except that the display apparatus further includes a cover electrode CV. The same or like elements shown in FIGS. 13 and 14 have been labeled with the same reference characters as used above to describe the embodiments of the display apparatus described above with reference to FIGS. 1 to 6, and any repetitive detailed description thereof will hereinafter be omitted or simplified.

The display apparatus may include a base substrate 100, a buffer layer 110, a first insulating layer 120, a first gate conductive layer, a second insulating layer 130, a second gate conductive layer, a third insulating layer 140, a first source drain conductive layer, a first via insulating layer VIA1, a second source drain conductive layer, a second via insulating layer VIA2, and a cover electrode CV.

The cover electrode CV may be disposed on a portion in which the second layer portion 220 of the first power line 200 extends to overlap the first layer portion 310 of the second power line 300. The first power line 200 and the second power line 300 may partially overlap each other. The cover electrode CV may be disposed in a same layer as the pixel electrode (see 181 of FIG. 6) and include a same material as the pixel electrode.

Meanwhile, in other embodiments (e.g., the embodiments described above with reference to FIGS. 7, 9, 11, etc.), a cover electrode may be further provided.

Figure 15:
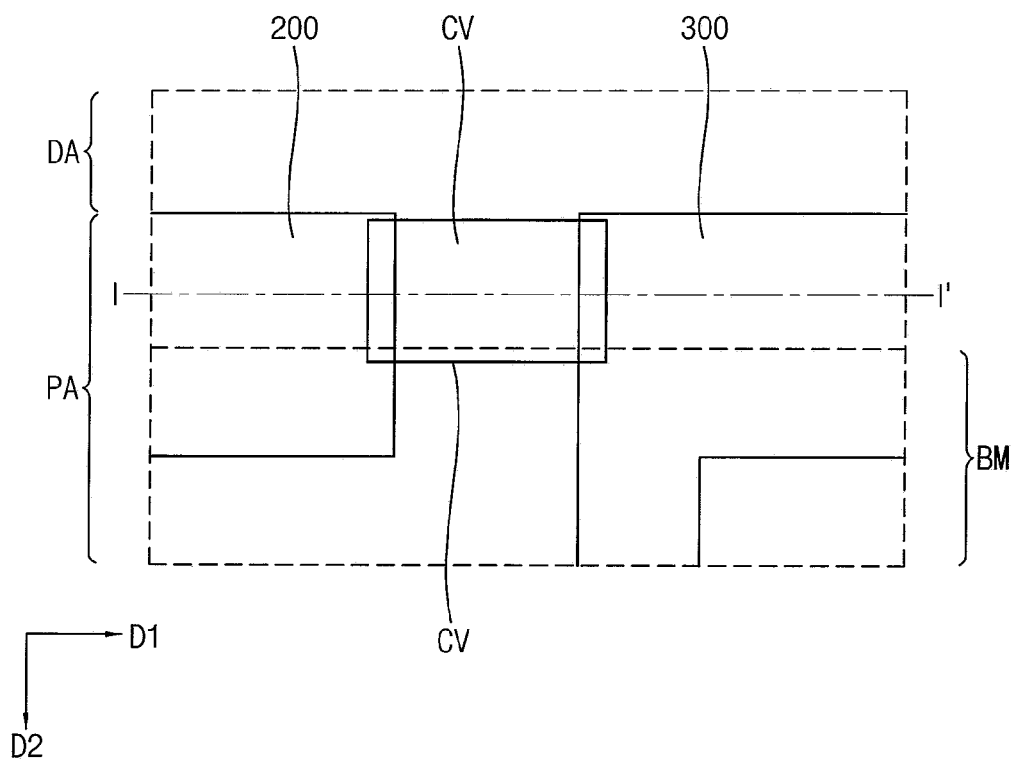
FIG. 15 is a partially enlarged view of a display apparatus according to another alternative exemplary embodiment of the invention.
Figure 16:
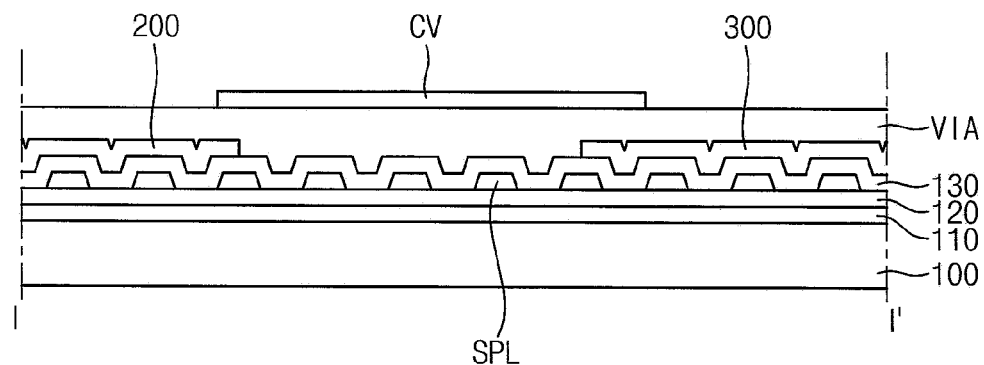
FIG. 16 is a cross-sectional view taken along line I-I' of FIG. 15.
Figure 17:
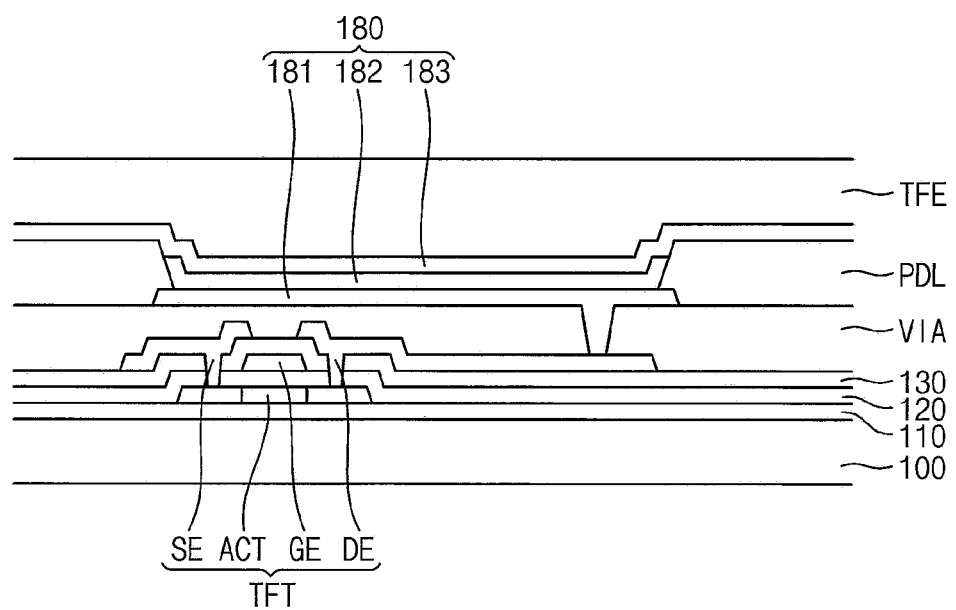
FIG. 17 is a cross-sectional view of a portion corresponding to a pixel of the display apparatus of FIG. 15.

FIG. 15 is a partially enlarged view of a display apparatus according to an exemplary embodiment of the invention. FIG. 16 is a cross-sectional view taken along line I-I' of FIG. 15. FIG. 17 is a cross-sectional view of a portion corresponding to a pixel of the display apparatus of FIG. 15.

Referring to FIGS. 15 to 17, in a peripheral area PA, the display apparatus may include a base substrate 100, a buffer layer 110, a first insulating layer 120, a gate conductive layer including a spider wiring SPL, a second insulating layer 130, a source drain conductive layer including a first power line 200 and a second power line 300, a via insulating layer VIA, and a cover electrode CV.

The buffer layer 110 may be disposed on the base substrate 100.

The first insulating layer 120 may be disposed on the buffer layer 110.

The gate conductive layer including the spider line SPL may be disposed on the first insulating layer 120.

The second insulating layer 130 may be disposed on the first insulating layer 120 on which the gate conductive layer is disposed.

A source drain conductive layer including the first power line 200 and the second power line 300 may be disposed on the second insulating layer 130.

The via insulation layer VIA may be disposed on the source drain conductive layer.

The cover electrode CV may be disposed on the via insulation layer VIA. The cover electrode CV may be disposed on a portion where the first power line 200 and the second power line 300 are separated from each other, and partially cover the first power line 200 and the second power line 300.

In the display area DA, the display apparatus may include the base substrate 100, the buffer layer 110, an active layer including an active pattern ACT of a thin film transistor TFT, the insulating layer 120, the gate conductive layer including the gate electrode GE of the thin film transistor TFT, the second insulating layer 130, the source drain conductive layer including the source electrode SE and the drain of the thin film transistor TFT, the via insulating layer VIA, a light emitting structure 180 including a pixel electrode 181, a light emitting layer 182 and an opposite electrode 183, and a thin film encapsulation layer TFE.

In an embodiment, the pixel electrode 181 and the cover electrode CV may be disposed in a same layer and include a same material as each other.

Figure 18:
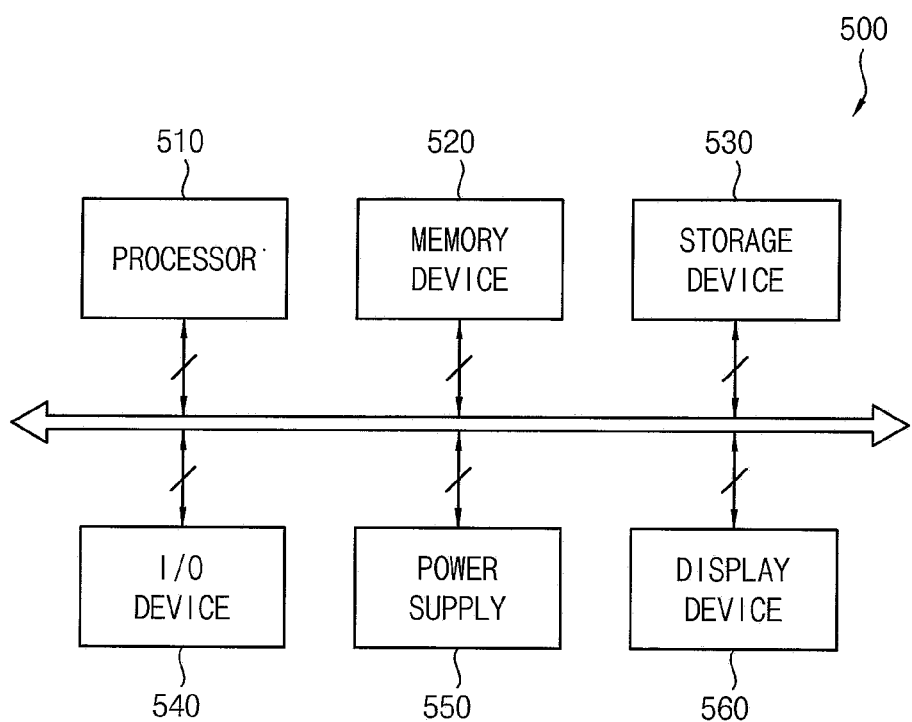
FIG. 18 is a block diagram illustrating an electronic device according to an exemplary embodiment.
Figure 19A:
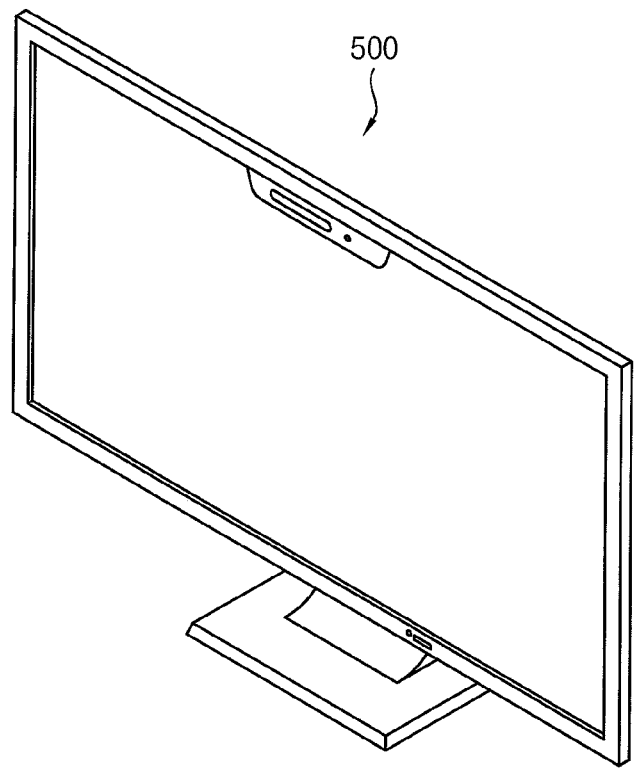
FIG. 19A is a diagram illustrating an exemplary embodiment of the electronic device of FIG. 18 implemented as a television.
Figure 19B:
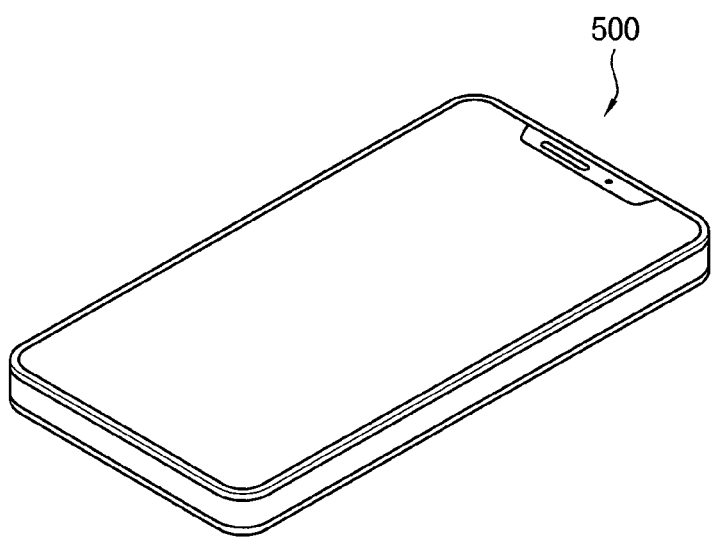
FIG. 19B is a diagram illustrating an exemplary embodiment of the electronic device of FIG. 18 implemented as a smart phone.

FIG. 18 is a block diagram illustrating an electronic device according to an exemplary embodiment. FIG. 19A is a diagram illustrating an exemplary embodiment of the electronic device of FIG. 18 implemented as a television. FIG. 19B is a diagram illustrating an exemplary embodiment of the electronic device of FIG. 18 implemented as a smart phone.

Referring to FIGS. 18 through 19B, an embodiment of the electronic device 500 may include a processor 510, a memory device 520, a storage device 530, an input/output ("I/O") device 540, a power supply 550, and a display apparatus 560. In such an embodiment, the display apparatus 560 may correspond to the display apparatus of FIG. 1. In such an embodiment, the electronic device 500 may further include a plurality of ports for communicating with a video card, a sound card, a memory card, a universal serial bus ("USB") device, other electronic devices, etc. In an embodiment, as illustrated in FIG. 19A, the electronic device 500 may be implemented as a television. In an alternative embodiment, as illustrated in FIG. 19B, the electronic device 500 may be implemented as a smart phone. However, the electronic device 500 is not limited thereto. In one embodiment, for example, the electronic device 500 may be implemented as a cellular phone, a video phone, a smart pad, a smart watch, a tablet personal computer ("PC"), a car navigation system, a computer monitor, a laptop computer, a head mounted display ("HMD"), etc.

The processor 510 may perform various computing functions. The processor 510 may be a microprocessor, a central processing unit ("CPU"), an application processor ("AP"), etc. In an embodiment, the processor 510 may be coupled to other components via an address bus, a control bus, a data bus, etc. In an embodiment, the processor 510 may be coupled to an extended bus such as a peripheral component interconnection ("PCI") bus. The memory device 520 may store data for operations of the electronic device 500. In one embodiment, for example, the memory device 520 may include at least one non-volatile memory device such as an erasable programmable read-only memory ("EPROM") device, an electrically erasable programmable read-only memory ("EEPROM") device, a flash memory device, a phase change random access memory ("PRAM") device, a resistance random access memory ("RRAM") device, a nano floating gate memory ("NFGM") device, a polymer random access memory ("PoRAM") device, a magnetic random access memory ("MRAM") device, a ferroelectric random access memory ("FRAM") device, etc., and/or at least one volatile memory device such as a dynamic random access memory ("DRAM") device, a static random access memory ("SRAM") device, a mobile DRAM device, etc. The storage device 530 may include a solid state drive ("SSD") device, a hard disk drive ("HDD") device, a CD-ROM device, etc. The I/O device 540 may include an input device such as a keyboard, a keypad, a mouse device, a touchpad, a touch-screen, etc., and an output device such as a printer, a speaker, etc. The power supply 550 may provide power for operations of the electronic device 500.

The display apparatus 560 may be coupled to other components via the buses or other communication links. In an embodiment, the display apparatus 560 may be included in the I/O device 540. In such an embodiment, as described above, a first power line and a second power line of the display apparatus 560 may be adjacent to a display area and have a structure overlapping each other in a peripheral area which is not covered by a light shielding pattern. As a result, display unevenness may be improved by reducing wiring unevenness due to reflection of external light, and by bending the bending area to minimize the non-display area, thereby providing a display apparatus in which the display area is enlarged. In such an embodiment, any repetitive detailed description of the same or like elements as those of the display apparatus described above will be omitted.

Embodiments of the invention may be applied to an organic light emitting display device and various electronic devices including the organic light emitting display device, for example, a mobile phone, a smart phone, a video phone, a smart pad, a smart watch, a tablet PC, a car navigation system, a television, a computer monitor, a laptop computer, and the like.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display apparatus, comprising:
a base substrate including a display area and a peripheral area, which is a non-display area and disposed adjacent to the display area, wherein a boundary line between the display area and the peripheral area extends in a first direction;
a first conductive layer including a first layer of a first power line and a first layer of a second power line, which are disposed on the base substrate in the peripheral area, wherein the first power line and the second power line extend in the first direction in a plan view; and
a second conductive layer including a second layer of the first power line and a second layer of the second power line, which are disposed on the base substrate in the peripheral area,
wherein a longitudinal side of the first layer of the first power line and a longitudinal side of the first layer of the second power line are arranged in a same first imaginary straight line in the first direction in the plan view,
wherein a longitudinal side of the second layer of the first power line and a longitudinal side of the second layer of the second power line are arranged in a same second imaginary straight line in the first direction in the plan view,
wherein the second layer of the first power line extending in the first direction overlaps the first layer of the first power line extending in the first direction in a thickness direction of the base substrate, is separated from the first layer of the first power line in the thickness direction of the base substrate by a via insulating layer, and is electrically connected to the first layer of the first power line,
wherein the second layer of the second power line extending in the first direction overlaps the first layer of the second power line extending in the first direction in the thickness direction of the base substrate, is separated from the first layer of the second power line in the thickness direction of the base substrate by the via insulating layer, and is electrically connected to the first layer of the second power line, and
wherein the first power line extending in the first direction and the second power line extending in the first direction overlap each other in the thickness direction of the base substrate.

2. The display apparatus of claim 1, wherein
a first power voltage is applied to the first power line, and
a second power voltage different from the first power voltage is applied to the second power line.

3. The display apparatus of claim 1, wherein the first via insulating layer comprises an organic insulating material.

4. The display apparatus of claim 3, wherein the second layer of the first power line overlaps the first layer of the second power line in the thickness direction of the base substrate.

5. The display apparatus of claim 1, further comprising:
a cover electrode disposed on the first layer of the first power line and the first layer of the second power line to cover a portion where the first layer of the first power line and the first layer of the second power line are spaced apart from each other.

6. The display apparatus of claim 5, further comprising:
a pixel electrode disposed in the display area on the base substrate;
a light emitting layer on the pixel electrode; and
an opposite electrode on the light emitting layer, and
wherein the cover electrode is disposed in a same layer as the pixel electrode and includes a same material as the pixel electrode.

7. The display apparatus of claim 1, further comprising:
a cover window including a light shielding pattern disposed in the peripheral area,
wherein the light shielding pattern is spaced apart from the display area when viewed from a plan view, and
wherein the light shielding pattern partially overlaps the first power line and the second power line in the thickness direction of the base substrate.

8. The display apparatus of claim 1, further comprising: a spider line disposed in the peripheral area on the base substrate, wherein the spider line is disposed between the base substrate and at least one power line selected from the first power line and the second power line.

9. The display apparatus of claim 8, wherein
the spider line includes a first layer spider line and a second layer spider line, and
the display apparatus further comprises an insulating layer disposed between the first layer spider line and the second layer spider line.

10. The display apparatus of claim 1, further comprising:
an active pattern disposed on the base substrate in the display area;
a gate electrode overlapping the active pattern in the thickness direction of the base substrate; and
a storage electrode overlapping the gate electrode in the thickness direction of the base substrate, and
wherein the first conductive layer further includes a source electrode and a drain electrode, which are electrically connected to the active pattern,
the second conductive layer further includes a second contact pad,
wherein the display apparatus further comprises:
a pixel electrode disposed in the display area and electrically connected to the contact pad;
a light emitting layer on the pixel electrode; and
an opposite electrode disposed on the light emitting layer.

* * * * *